United States Patent
Wong et al.

(10) Patent No.: US 6,954,987 B2
(45) Date of Patent: Oct. 18, 2005

(54) METHOD OF INTERCONNECTING A CIRCUIT BOARD TO A SUBSTRATE

(75) Inventors: Kenneth Daryl Wong, Folsom, CA (US); Sean L. Bell, Folsom, CA (US)

(73) Assignee: Powerwave Technologies, Inc., Santa Ana, CA (US)

(*) Notice: Subject to any disclaimer, the term of this patent is extended or adjusted under 35 U.S.C. 154(b) by 0 days.

(21) Appl. No.: 10/849,478

(22) Filed: May 19, 2004

(65) Prior Publication Data

US 2004/0231884 A1 Nov. 25, 2004

Related U.S. Application Data

(60) Provisional application No. 60/472,710, filed on May 22, 2003.

(51) Int. Cl.$^7$ ................................................ H01K 3/10
(52) U.S. Cl. ............................. 29/852; 29/830; 29/840; 29/846
(58) Field of Search .......................... 29/825, 832, 840; 174/259, 260; 228/179.1, 180.21; 361/690, 694; 439/66

(56) References Cited

U.S. PATENT DOCUMENTS

| | | | |
|---|---|---|---|
| 5,461,923 A | * 10/1995 | Meisterling | 73/761 |
| 5,759,047 A | * 6/1998 | Brodsky et al. | 439/66 |
| 5,984,164 A | * 11/1999 | Wark | 228/164 |
| 5,984,691 A | * 11/1999 | Brodsky et al. | 439/66 |
| 6,164,124 A | * 12/2000 | Fujii et al. | 73/105 |
| 6,234,373 B1 | * 5/2001 | Wark | 228/19 |
| 6,421,253 B1 | 7/2002 | Ash, Jr. | |
| 6,464,124 B2 | 10/2002 | Wark | 228/19 |
| 6,617,682 B1 | * 9/2003 | Ma et al. | 257/706 |
| 6,794,223 B2 | * 9/2004 | Ma et al. | 438/122 |

FOREIGN PATENT DOCUMENTS

| | | |
|---|---|---|
| JP | 9-115575 | 5/1997 |
| JP | 09-115575 A * | 5/1997 |
| JP | 9-148481 | 6/1997 |
| JP | 09-148481 A * | 6/1997 |
| JP | 2000-114414 | 4/2000 |
| JP | 2000-114414 A * | 4/2000 |

* cited by examiner

*Primary Examiner*—Carl J. Arbes
(74) *Attorney, Agent, or Firm*—Myers Dawes Andras & Sherman LLP

(57) ABSTRACT

A printed circuit board assembly employing a solder vent hole adjacent solder filled interconnect vias connecting to a conductive pallet, is disclosed. The solder vent hole allows gases to escape from an otherwise sealed cavity during solder reflow, relieving positive pressure and thereby allowing solder to flow into it. By providing an escape path for trapped air and gases generated during solder paste reflow, the out-gassing pressure and weight of the molten solder is sufficient to allow the solder paste to flow into the cavity.

9 Claims, 3 Drawing Sheets

METHOD OF INTERCONNECTING A CIRCUIT BOARD TO A SUBSTRATE

RELATED APPLICATION INFORMATION

This patent application claims the benefit pursuant to 35 USC §119(e) of the priority date of U.S. Provisional Patent Application Ser. No. 60/472,710, filed on May 22, 2003, the entire contents of which are hereby expressly incorporated herein by reference.

BACKGROUND OF THE INVENTION

1. Field of the Invention

The present invention relates to printed circuit board assemblies and methods for assembling electronic components into multi-layer assemblies. More particularly, the present invention relates to RF power amplifier circuit board assemblies and related methods of assembly.

2. Description of the Prior Art and Related Background Information

In high power electronics assemblies generating a relatively high amount of heat, it is typically necessary to attach a printed circuit board (PCB) containing electronic components to a metal substrate provided as a heat sink. RF power amplifiers are an example of such electronics module assemblies that incorporate heat dissipation means by design. The metal substrate for an electronics module may further be needed for grounding and electromagnetic interference (EMI) shielding. The use of nonconductive adhesives is a particular cost effective method of attaching a two sided printed circuit board to a metal substrate. The drawback to this approach is that there is no intimate metal-to-metal contact between the metal substrate and the metalized backside of the PCB. To achieve electrical and thermal contact at critical locations of this interface, it is desirable to use surface applied solder paste that is applied to a top surface of the PCB. However, trapped air and gases created during the solder reflow process create backpressure and prevent the molten solder from flowing.

Accordingly, a need presently exists for a way to use cost effective nonconductive adhesive bonding and also provide effective electrical and thermal coupling to the substrate using surface applied solder reflow techniques.

BRIEF SUMMARY OF THE INVENTION

In a first aspect the present invention provides an electronics assembly comprising a printed circuit board having a via hole therethrough and an adjacent vent hole, a nonconductive adhesive layer having a first surface and a second surface, the first surface coupled to the printed circuit board, and a conductive substrate coupled to the adhesive layer second surface so that the adhesive layer is disposed between the printed circuit board and the substrate. The adhesive layer further has a void space overlapping the via hole and the vent hole. Reflowed solder is provided extending into the void space, the reflowed solder connecting the printed circuit board to the substrate.

In a preferred embodiment of the electronics assembly a plurality of electronic devices are mounted on the printed circuit board. The substrate is preferably made from an electrically conductive material and the substrate provides electrical grounding for one or more of the electronic devices on the printed circuit board through the reflowed solder. A metalized pad may be provided plating and surrounding the via hole or vent hole. The substrate is also preferably made from a thermally conductive material and provides heat dissipation for the printed circuit board through the reflowed solder. For example, the substrate may be made from copper. The nonconductive adhesive layer may be composed of a thermal set epoxy.

According to another aspect the present invention provides a method of interconnecting a printed circuit board, having a via hole and a vent hole, and a conductive substrate. The method comprises coupling the substrate to the printed circuit board using a nonconductive adhesive layer, the adhesive layer having a space forming a cavity between the substrate and the printed circuit board aligned to the via hole and vent hole. The method further comprises reflowing solder from a top surface of the printed circuit board through the via hole to electrically connect the printed circuit board to the conductive substrate while relieving pressure in the cavity by venting gases in the cavity through the vent hole in the printed circuit board.

The method of interconnecting a printed circuit board to a substrate may further comprise plating the via hole or vent hole before the reflowing of the solder. The substrate is preferably made from a metal material and the substrate provides electrical grounding and heat dissipation for the printed circuit board through the reflowed solder. The adhesive layer is preferably an epoxy layer. For example, the epoxy layer may be a thermal set epoxy and the method comprises curing the epoxy at an elevated temperature.

According to another aspect the present invention provides an RF power amplifier circuit board assembly comprising a printed circuit board having a via hole therethrough, an adjacent vent hole therethrough, and one or more RF power transistors mounted thereon. The assembly further comprises a nonconductive adhesive layer having a first surface and a second surface, the first surface coupled to the printed circuit board. An electrically conductive substrate is coupled to the adhesive layer second surface so that the adhesive layer lies between the printed circuit board and the substrate, the adhesive layer having a void space aligned to the via hole and vent hole. Reflowed solder extends through the via hole and the void space to the substrate, the reflowed solder electrically connecting the printed circuit board to the substrate. One or more conductive traces are provided on the printed circuit board electrically connecting to the reflowed solder.

The RF amplifier circuit board assembly may further comprise a metalized pad plating and surrounding the via hole or the vent hole. The substrate is preferably composed of metal and the substrate provides electrical grounding and heat dissipation for the printed circuit board through the reflowed solder.

According to another aspect the present invention provides a method of assembling and electrically coupling a metal substrate to an RF printed circuit board. The method comprises providing a printed circuit board having a via hole, a vent hole adjacent the via hole, one or more RF power transistors and one or more conductive traces. The method comprises providing a conductive metal substrate and a nonconductive layer between the printed circuit board and substrate, the nonconductive layer having an opening below the via hole and vent hole thereby forming a cavity. The method further comprises surface applying solder paste to the via hole and heating and reflowing the solder paste from the top surface of the printed circuit board through the via hole and opening in the nonconductive layer to electrically connect the conductive trace to the conductive metal substrate while relieving pressure in the cavity by venting gases in the cavity through the vent hole.

In a preferred embodiment of the method of assembling and electrically coupling a conductive substrate to an RF printed circuit board, the conductive metal substrate is made from copper. The nonconductive layer preferably comprises an epoxy layer and the method comprises bonding the printed circuit board to the conductive substrate using the nonconductive epoxy layer. The conductive trace may be an RF ground connection.

These and further aspects and features of the invention will be appreciated from the following detailed description.

DETAILED DESCRIPTION OF THE PREFERRED EMBODIMENTS

Figure 1:
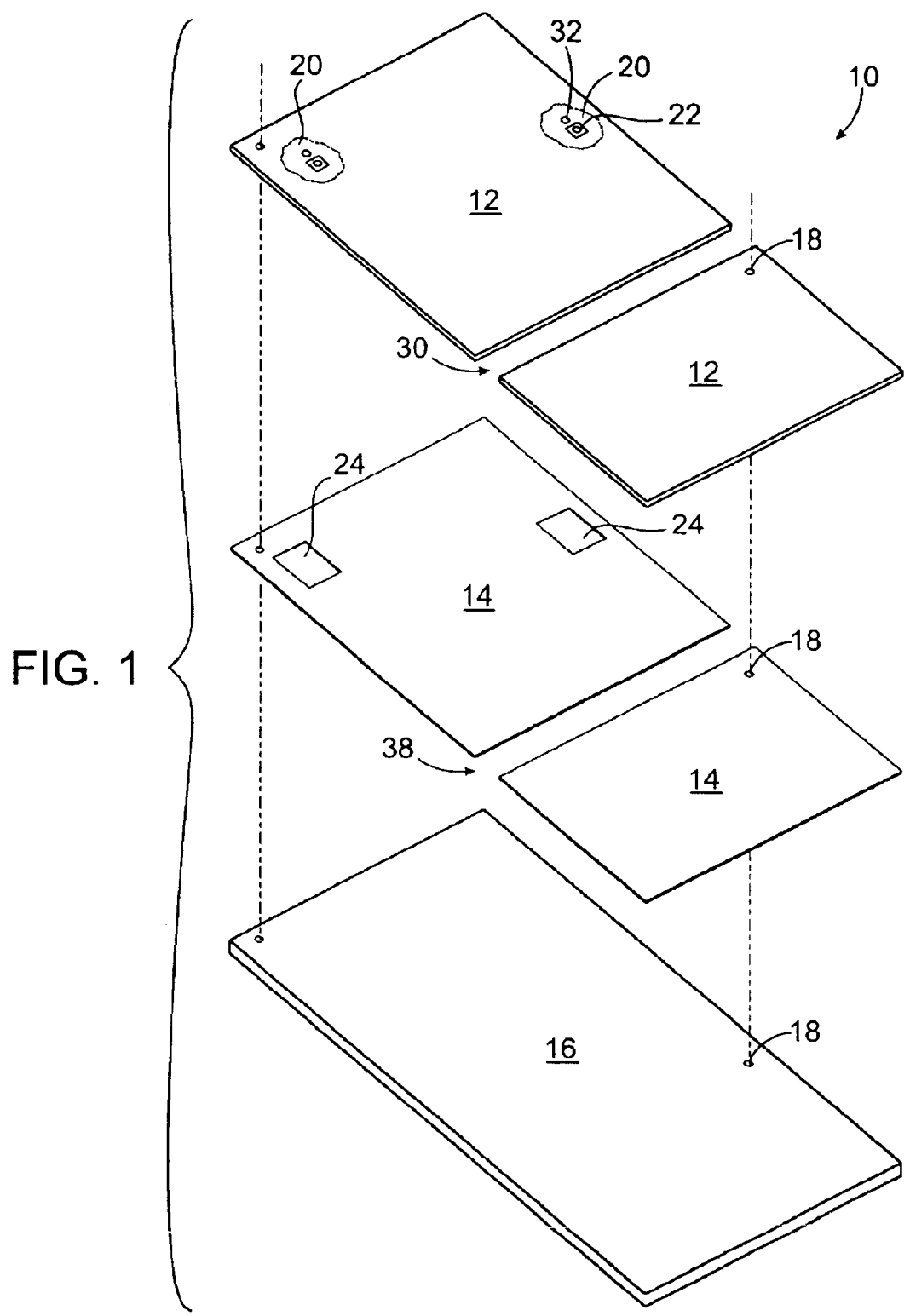
FIG. 1 is an exploded perspective view of an electronics assembly in accordance with a preferred embodiment of the present invention showing individual layers.
Figure 3:
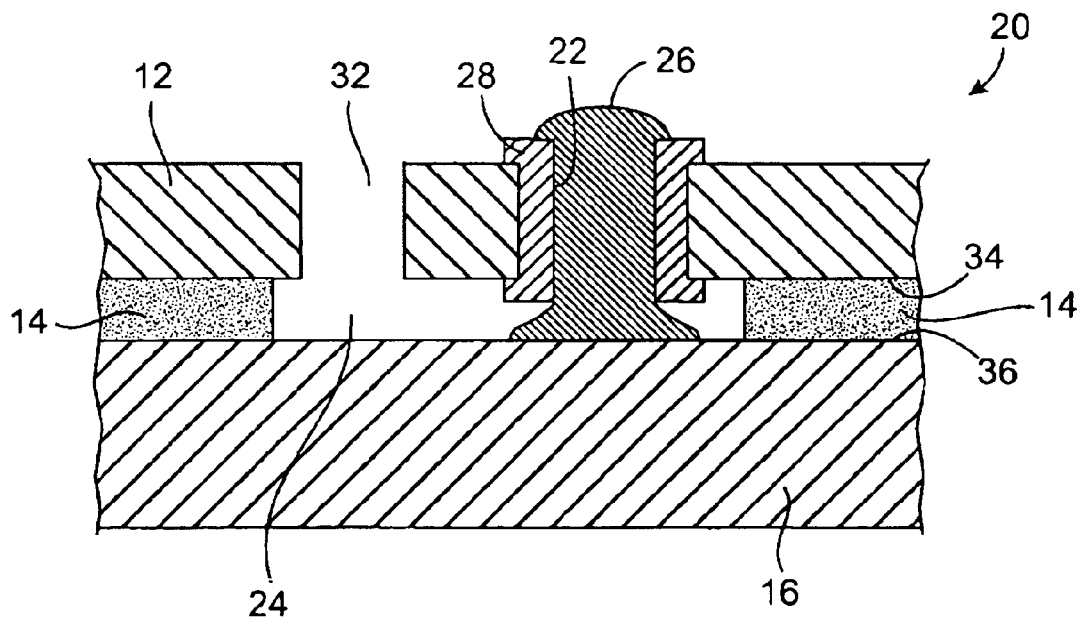
FIG. 3 is a cross-sectional view of the interconnect portion as seen along sectional line 3—3 of FIG. 2.

FIG. 1 is an exploded perspective view of an electronics assembly 10 in accordance with a preferred embodiment of the present invention. In this example, assembly 10 comprises printed circuit board (PCB) layer 12, nonconductive adhesive layer 14, and a conductive support substrate or pallet 16. Pallet 16 is composed of a good electrical and thermal conductor, preferably a metal such as copper. Printed circuit board layer 12 is attached to the conductive substrate 16 using the nonconductive adhesive 14 (as shown in FIG. 3). For example, a thermal set sheet epoxy 14 may be employed. The use of a thermal set nonconductive adhesive sheet (or preform) to attach a printed circuit board to a metal substrate is disclosed in U.S. Pat. No. 6,421,253 to Daniel Ash, Jr., issued Jul. 16, 2002, the disclosure of which is incorporated herein by reference in its entirety. The PCB layer 12 includes various active and passive electronic components (shown generally in FIG. 4) and in one preferred embodiment may be a two sided PCB having electronic components and/or conductive traces on both sides (as described in more detail in the '253 patent). Some of these components will require electrical and/or thermal contact to the substrate. More particularly, in one preferred embodiment the assembly 10 is adapted for high power electronics applications, such as RF power amplifiers, and PCB layer 12 may further comprise a number of RF modules and discrete components. Such power amplifier components may include output couplers, power resistors, active amplifier devices (such as bipolar or LDMOS power transistors), EMI shielding (such as a ground plane in the circuit board, a shielding wall or lid), and other components well known to those skilled in the art.

The assembly 10 includes layer interconnect portions 20 which provide the desired electrical and/or thermal contact of the PCB layer 12 to the pallet 16. These interconnect portions comprise via holes 22 for electrically and/or thermally interconnecting layers 12 and 16 and adjacent vent holes 32 (interconnect portions 20 are illustrated in detail in FIGS. 2 and 3). The layers 12 and 14 are both illustrated in two sections providing respective spaces 30, 38 which allow mounting of certain components such as power transistors, directly on the pallet 16 for better thermal dissipation. Single piece layers 12 and 14 may also be employed, however, with the interconnect portions 20 providing the thermal coupling to pallet 16 or the layers 12 and 14 may have openings for mounting selected components directly on the pallet. The layers 12, 14, 16 may also have additional mounting holes 18 for structurally connecting the layers or coupling the pallet to a heat sink and/or to a lid. Adhesive layer 14 further includes void spaces 24 aligned with the interconnect portions 20. As shown in FIGS. 1 through 4, void spaces 24 form a cavity in the electronics assembly 10 under both the via holes 22 and vent holes 32 through to pallet 16.

Figure 2:
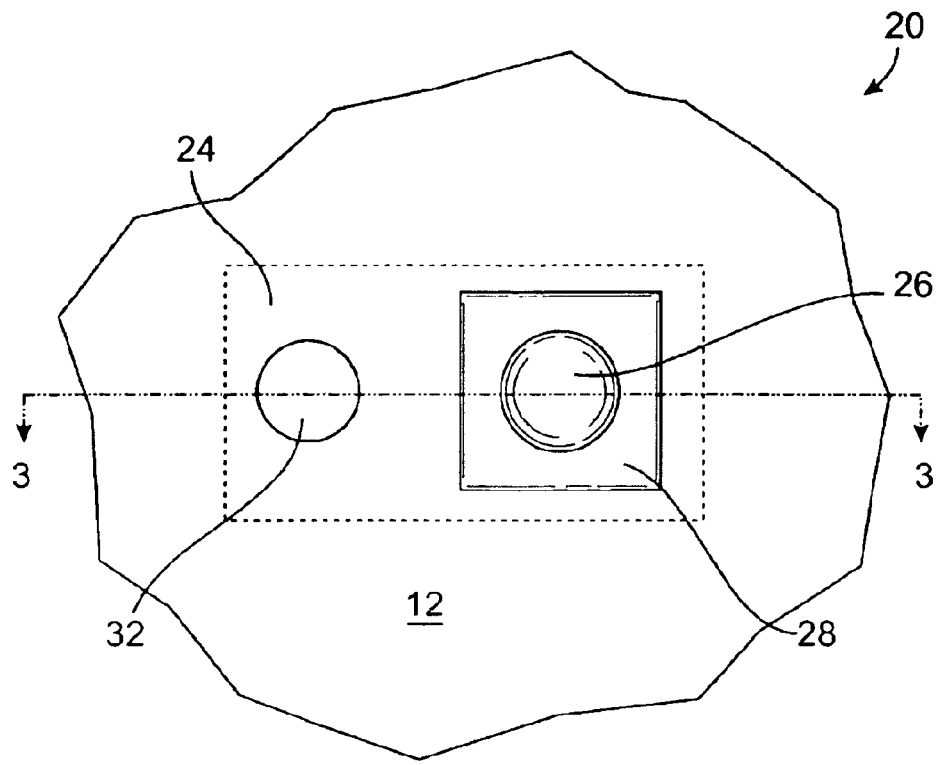
FIG. 2 is a top view of an interconnect portion of the electronics assembly of FIG. 1.

Referring to FIGS. 2 and 3 the layer interconnect portions 20 will be described in more detail. FIG. 2 is a top view of one of the layer interconnect portions 20 of electronics assembly 10. Cavity 24 is referenced by the dashed lines as physically beneath PCB layer 12. FIG. 3 is a cross sectional view of the interconnect portion 20, taken along sectional line 3—3.

Figure 4:
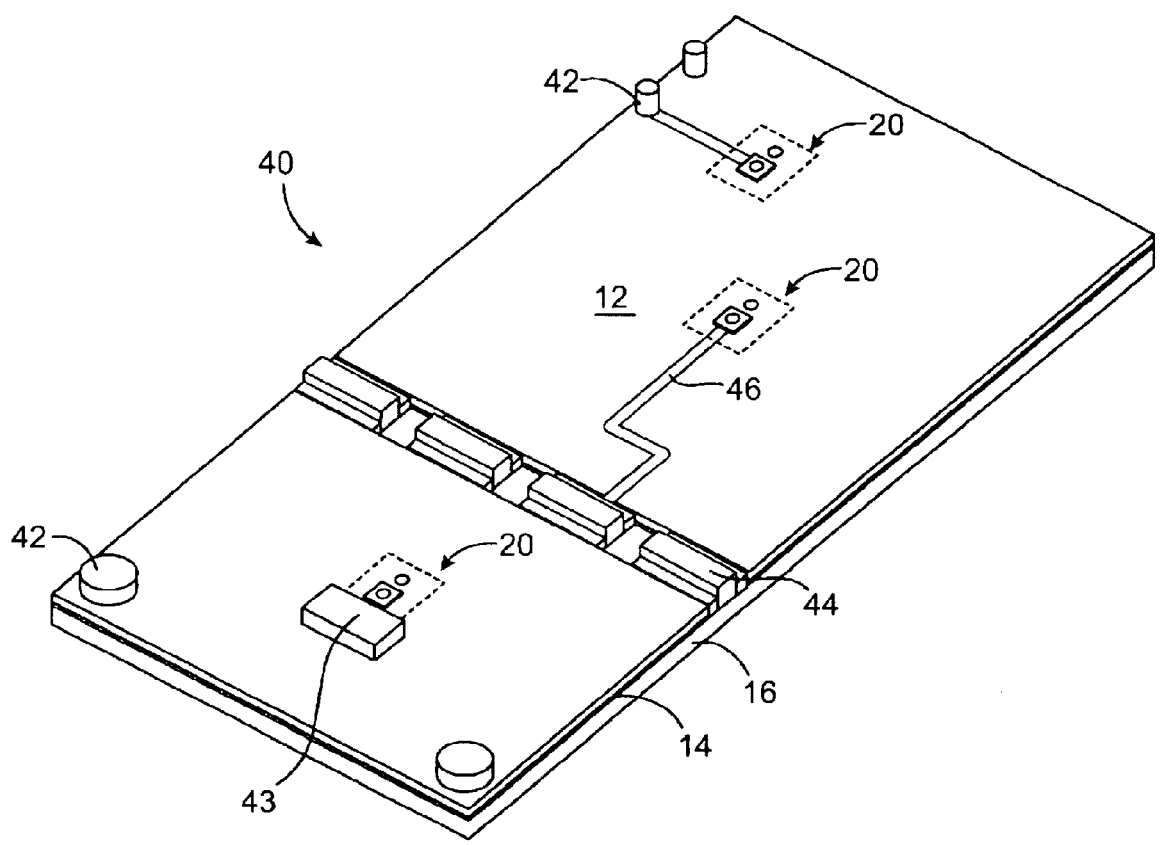
FIG. 4 is an exemplary RF printed circuit board assembly in accordance with the present invention.

As shown in FIGS. 2 and 3, the electrical and/or thermal contact to the substrate 16 is provided by metalized pad(s) 28 with plated via holes 22 and surface applied reflowed solder 26. The metalized pads 28 are electrically coupled to traces on the PCB layer and/or are configured adjacent to and in electrical and/or thermal contact with selected electronic components on the PCB layer 12 (as generally shown in FIG. 4). As illustrated in FIG. 3, after assembly and curing the epoxy layer 14 has a first surface 34 coupled to the printed circuit board layer 12 and a second surface 36 coupled to the substrate 16 so that the epoxy layer is disposed between the printed circuit board 12 and the substrate. As shown, spaces 24 in the nonconductive adhesive sheet 14 are provided for making contact between the printed circuit board and the metal substrate with the reflowed solder 26. The spaces 24 in the epoxy sheet 14 would normally create air tight voids 24 as may be seen from FIG. 3, which would prevent surface applied solder 26 from flowing into the hole 22 to make adequate contact with the substrate 16 due to increased pressure of air trapped in the void as the solder is heated. Other gases and further backpressure may be created by the reflowed solder itself. To address this problem, vent hole 32 is provided in the PCB layer 12 adjacent to each via 22 and extending into void 24. The via holes 22 and vent holes 32 may be provided in the PCB 12 through any of a variety of known techniques, including drilling, etching or during formation of the PCB material. The vent hole 32 may be provided either before or after assembly with the substrate 16, prior to solder reflow processing, and may preferably be formed together with via hole 22 to facilitate alignment of the two holes in a closely spaced configuration. The vent hole 32 very effectively relieves gaseous backpressure in the void 24, thereby allowing applied solder paste 26 to flow down through the vias 22 and connect the printed circuit board 12 to the substrate 16 as shown. Alternatively, the metal plating 28 may be applied to vent hole 32. In this approach the solder paste is applied to via hole 22 as before and upon heating flows down into void 24 and flows across the void to the vent hole to contact the plating 28 and electrically and thermally connect plating 28 and substrate 16. In this embodiment the vent hole rather than the via hole acts as the electrical and/or thermal connection point. (It will be readily appreciated that FIG. 3 equally illustrates this alternate structure with reference numeral 22 now indicating the vent hole and reference numeral 32 the via hole, although in this embodiment the solder 26 may be localized mostly in the void 24 and not extend as far up toward the top surface of PCB layer 12 as is shown in FIG. 3). In this embodiment the via hole 22 may be of larger diameter than the vent hole 32 to facilitate the solder flow and the two holes are preferably very closely spaced. Also, the gas venting assists in the solder flow and this embodiment may enhance this effect making it a preferred approach for some applications. Therefore, in either embodiment due to vent hole 32, the desired good electrical and/or thermal contact to the substrate 16 is provided by the reflowed solder.

In FIG. 4, an exemplary RF power amplifier circuit board assembly 40 of the present invention is illustrated. The illustrated assembly is highly schematic in nature as specific implementations will have a variety of layouts and components, as will be appreciated by those skilled in the art. The RF power amplifier circuit board assembly 40 comprises a printed circuit board 12 having interconnect portion(s) 20 (as illustrated in FIGS. 2 and 3). Further, RF power amplifier circuit board assembly 40 has one or more RF power transistors 44 and various other discrete components 42, 43 mounted thereon. The RF power amplifier circuit board also includes conductive circuit traces 46 that interconnect discrete components and also provide a ground connection, as explained herein, to the pallet 16 through interconnect portions 20. Conductive traces 46 are shown on the top surface of PCB layer 12 in FIG. 4, for ease of illustration, but traces may also be configured on the bottom surface of PCB layer 12 as described in more detail in the '253 patent. A ground plane layer may also be provided within layer 12 and this may also connect to ground traces 46 and the pallet 16 through interconnect portions 20. Also, interconnect portions 20 may be disposed adjacent selected electronic components to provide thermal coupling to the pallet 16 for "hot spots", even where electrical connections are not needed (as illustrated generally by component 43 and adjacent interconnect portion 20).

The invention as illustrated herein additionally includes a method of assembling and interconnecting a PCB to a conductive substrate. The modifications to the method of assembly described in the above noted '253 patent will be apparent from the above. A preferred embodiment of this method comprises assembling PCB 12 and substrate 16 using a nonconductive adhesive layer 14, followed by reflowing solder through the via hole 22 in the PCB and the cavity 24 below the via hole 22. More specifically the method comprises applying solder paste 26 to the via hole 22 from above using conventional techniques and heating the solder paste 26 to a temperature to provide reflow of the solder paste into the via hole. The vent holes 32 assist the reflow process by venting gases in the cavity 24 and relieving backpressure as described above. The solder paste thus flows from the upper surface of the printed circuit board 12 through the via hole 22 into cavity 24 to electrically connect to the conductive substrate 16 while substantially maintaining equalized pressure through the venting of the cavity 24. Other aspects and features of the method of the invention may incorporate additional teachings of the '253 patent. For example, details on the provision of a suitable nonconductive adhesive layer 14, such as a thermal set epoxy perform, and bonding of the layers using the adhesive, are disclosed in the '253 patent and may be employed herein, as will be readily appreciated by those skilled in the art.

While various embodiments of the invention have been described, it will be apparent to those of ordinary skill in the art that many more embodiments and implementations are possible that are within the scope of this invention. It is understood that such changes in the specific structure and method shown and described may be made within the scope of the claims, without departing from the spirit of the invention. Also, nothing herein is intended to limit or waive the full scope of the meaning of the claims or limit in any way the scope of equivalents of the claims under the judicial doctrine of equivalents.

What is claimed is:

1. A method of interconnecting a printed circuit board, having a via hole and a vent hole, and a conductive substrate, the method comprising:

coupling the substrate to the printed circuit board using a nonconductive adhesive layer, the adhesive layer having a space forming a cavity between the substrate and the printed circuit board aligned to the via hole and vent hole; and reflowing solder from a top surface of the printed circuit board through the via hole to electrically connect the printed circuit board to the conductive substrate while relieving pressure in the cavity by venting gases in the cavity through the vent hole in the printed circuit board.

2. The method of interconnecting a printed circuit board to a substrate of claim 1, further comprising plating the via hole before the reflowing.

3. The method of interconnecting a printed circuit board to a substrate of claim 1, wherein the substrate is made from a metal material and wherein the substrate provides electrical grounding and heat dissipation for the printed circuit board through the reflowed solder.

4. The method of interconnecting a printed circuit board to a substrate of claim 1, wherein the adhesive layer is an epoxy layer.

5. The method of interconnecting a printed circuit board to a substrate of claim 4, wherein the epoxy layer is a thermal set epoxy and the method comprises curing the epoxy at an elevated temperature.

6. A method of assembling and electrically coupling a metal substrate to an RF printed circuit board, the method comprising:

providing a printed circuit board having a via hole, a vent hole adjacent the via hole, one or more RF power transistors and one or more conductive traces;

providing a conductive metal substrate;

providing a nonconductive layer between the printed circuit board and substrate the nonconductive layer having an opening below the via hole and vent hole thereby forming a cavity;

surface applying solder paste to the via hole; and heating and reflowing the solder paste from the top surface of the printed circuit board through the via hole and opening in the nonconductive layer to electrically connect the conductive trace to the conductive metal substrate while relieving pressure in the cavity by venting gases in the cavity through the vent hole.

7. The method of assembling and electrically coupling a conductive substrate to an RF printed circuit board of claim 6, wherein the conductive metal substrate is made from copper.

8. The method of assembling and electrically coupling a conductive substrate to an RF printed circuit board of claim 6, wherein the nonconductive layer comprises an epoxy layer and the method further comprises bonding the printed circuit board to the conductive substrate using the nonconductive epoxy layer.

9. The method of assembling and electrically coupling a conductive substrate to an RF printed circuit board of claim 6, wherein the conductive trace is an RF ground connection.

* * * * *